United States Patent
Cathey et al.

(10) Patent No.: US 6,232,218 B1
(45) Date of Patent: May 15, 2001

(54) ETCH STOP FOR USE IN ETCHING OF SILICON OXIDE

(75) Inventors: David A. Cathey; J. Brett Rolfson, both of Boise; Valerie A. Ward, Meridian; Karen M. Winchester, Eagle, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/377,100

(22) Filed: Aug. 19, 1999

Related U.S. Application Data

(63) Continuation of application No. 08/558,777, filed on Nov. 15, 1995, now Pat. No. 6,004,875.

(51) Int. Cl.[7] .................................................. H01L 45/00
(52) U.S. Cl. ........................ 438/634; 438/703; 438/723; 438/724; 438/743; 438/744; 438/770; 438/732; 438/791; 438/792; 257/640
(58) Field of Search ..................................... 438/634, 703, 438/723, 724, 743, 744, 740, 732, 791 792; 257/640

(56) References Cited

U.S. PATENT DOCUMENTS

| | | | |
|---|---|---|---|
| 3,670,403 | 6/1972 | Lawrence et al. | 29/571 |
| 4,259,366 | 3/1981 | Balasubramanian et al. | 427/88 |
| 4,367,119 | 1/1983 | Logan et al. | 156/643 |
| 4,447,824 | 5/1984 | Logan et al. | 357/71 |
| 4,532,695 | 8/1985 | Schuermeyer | 29/571 |
| 4,946,550 | 8/1990 | Van Laarhoven | 156/643 |
| 4,956,314 | 9/1990 | Tam et al. | 437/241 |
| 5,041,888 | 8/1991 | Possin et al. | 357/23.7 |
| 5,057,391 | 10/1991 | Hayakawa et al. | 430/66 |
| 5,288,645 | 2/1994 | Toshima et al. | 436/144 |
| 5,562,952 | 10/1996 | Nakahigashi et al. | 427/534 |
| 5,622,596 | 4/1997 | Armacost et al. | 438/702 |
| 5,635,423 | 6/1997 | Huang et al. | 437/195 |

OTHER PUBLICATIONS

M. Hirose, "Plasma Deposition of Silicon Nitride," JARECT vol. 8, Semiconductor Technologies (1983), J. Nishizawa (ed.), pp. 85–96.

M. Sato et al., "Submicron electron–beam patterning of aluminum by a double–layer pattern transfer technique," J. Vac. Sci. Technol., 19(4), Nov./Dec. 1981, pp. 1329–1332.

S. Yokoyama et al., "Characterization of plasma–deposited silicon nitride films," J. Appl. Phys. 51(10), Oct. 1980, pp. 5470–5474.

S. Wolf et al., "Silicon Processing For The VLSI Era," vol. I: Process Technology, Sunset Beach, California, pp. 192–194, p. 555.

*Primary Examiner*—Charles Bowers
*Assistant Examiner*—Lisa Kilday
(74) *Attorney, Agent, or Firm*—Fletcher, Yoder & Van Someren

(57) ABSTRACT

A etch stop layer for use in a silicon oxide dry fluorine etch process is made of silicon nitride with hydrogen incorporated in it either in the form of N—H bonds, O—H bonds, or entrapped free hydrogen. The etch stop layer is made by either increasing the $NH_3$ flow, decreasing the $SiH_4$ flow, decreasing the nitrogen flow, or all three, in a standard PECVD silicon nitride fabrication process. The etch stop can alternatively be made by pulsing the RF field in either a PECVD process or an LPCVD process.

43 Claims, 5 Drawing Sheets

ETCH STOP FOR USE IN ETCHING OF SILICON OXIDE

This application is a continuation of Ser. No. 08/558,777, filed Nov. 15, 1995, now U.S. Pat. No. 6,004,875.

BACKGROUND OF THE INVENTION

1. Field of the Invention

The invention in general relates to integrated circuit fabrication processes and more particularly to a silicon-nitride-based material for use as an etch stop when etching silicon dioxide in such fabrication processes and a method of making such an etch stop material.

2. Statement of the Problem

Integrated circuits are mass produced by fabricating hundreds of identical circuit patterns on a single semiconductor wafer. Subsequently, the wafer is sawed into hundreds of identical dice or chips. While sometimes referred to as "semiconductor devices", integrated circuits are in fact fabricated from patterned layers of conductors, insulators, and semiconductors. Silicon, the most commonly used semiconductor material, is used in either the single crystal or polycrystalline form. One type of semiconductor wafer fabrication process, which the embodiment of the invention described herein utilizes, begins with a single crystal silicon substrate. Silicon dioxide is also commonly used in integrated circuits as an insulator or dielectric. Its use is so common that in the art is generally referred to as "oxide" without ambiguity.

Silicon dioxide is routinely used in integrated circuit fabrication technology by forming a layer of the material on the integrated circuit wafer, then removing portions of the layer in a photo mask and etch process. In such a photo mask and etch process, a photo mask containing the pattern of the structure to be fabricated is created, then, after formation of the silicon dioxide layer, the wafer is coated with a light-sensitive material called photoresist or resist. Resists are termed either positive or negative, a negative resist being a material which on exposure to light becomes less soluble in a developer solution, and a positive resist being a material which on exposure to light becomes more soluble in a developer solution.

The resist-coated wafer is then exposed to ultraviolet light through the mask. Upon exposure to the light, cross polymerization occurs in a negative resist making it insoluble in organic-based developers; in a positive resist, carboxylic acid groups are formed, rendering it soluble in basic pH media. The more soluble parts of the resist are then removed in a process called "developing." The wafer is etched to remove the silicon oxide unprotected by the resist, and then the remaining resist is stripped. This masking process permits specific areas of the silicon dioxide to be formed to meet the device design requirements.

In the etch process described above, it is important that the etch selectively remove the unwanted silicon dioxide and that the material underlying the silicon dioxide layer is not damaged. A common way to accomplish this is to deposit or otherwise form an etch stop layer on the wafer prior to formation of the silicon dioxide. Such etch stop layers are commonly made of an insulating material that is resistant to the particular etch process used. In the integrated circuit fabrication art, the property of being resistant to an etch process is called the "selectivity" of a material. The selectivity S of a particular material in a particular etch process is usually defined as the etch rate of the material to be removed divided by the etch rate of the particular material. Thus, a material that is highly resistant to an etch is said to have a high selectivity. Common insulators that have a high selectivity in silicon dioxide etch processes and are used as etch stop layers are aluminum oxide ($Al_2O_3$), titanium dioxide ($TiO_2$), and silicon nitride ($Si_3N_4$) Aluminum oxide and titanium dioxide present a risk of contamination of the wafer with metal and other particles that can create defects in the electrical circuits, and thus are used sparingly, and in particular are generally not used in high volume integrated circuit manufacturing processes such as DRAM fabrication. Silicon nitride has been used as an etch stop layer for etching silicon dioxide in DRAM fabrication processes.

One common method of etching silicon dioxide is in a fluorine plasma, such as $CF_4$, $C_2F_6$, $SF_6$, or $NF_3$, while using silicon nitride as an etch stop. Often fluorine plasma etches are performed under conditions that provide a directional or anisotropic etch so that the sidewalls of the etched feature are nearly vertical. It is known to add polymerizing agents, such as $C_2F_2$, $CHF_3$, and other such carbon containing materials to a fluorine plasma to provide a high selectivity to silicon nitride. It has also been found that if enough hydrogen is present in the plasma, such polymerizing agents can condense out on the silicon dioxide and stop the etch of the silicon dioxide. If an oxygen source is supplied to the plasma, the deposition of the polymers decreases or is prevented altogether. However, increased oxygen tends to make the etch less directional or more isotropic.

There is much literature in the art related to fine tuning such fluorine etches by use of polymers and oxygen to maximize the selectivity to silicon nitride while preventing polymer deposition. All of this art teaches that adding large quantities of hydrogen to the plasma is counterproductive, due to the deposition of polymer on the reactor walls and narrow process windows. Further, the art relating to the use of silicon nitride in integrated circuit manufacturing processes teaches that hydrogen should be excluded because it lightens the material, which is considered to be detrimental to a dielectric. The plasma etch art shows also that it is very difficult to control the oxide etching process described above: that is, the better the selectivity, the more chance there is of polymer deposition.

These processes are thus balanced on the edge of disaster, with the strong possibility of sudden, massive depositions of polymer that ruin the wafers. There is a need therefore for a silicon dioxide etching process and etch stop layer material that provides high selectivity while also being controllable, without the potential of contamination of the wafer.

Generally, a change in one phase of the integrated fabrication process impacts other phases. Since integrated circuit fabrication processes are highly complex and require sophisticated equipment, developments of entirely new processes and materials can be quite costly. Thus new methods and materials for silicon dioxide etching that can be incorporated into current fabrication technology would be desirable because expensive modification of equipment and processes can be avoided.

3. Solution to the problem:

The present invention solves the above problems by providing an etch stop material with improved selectivity. The invention provides one or more methods of making silicon nitride etch stop material that has higher selectivity in silicon dioxide etch processes than silicon nitride made by prior art processes.

Analysis indicates that the invention provides an etch stop material comprising silicon nitride containing added hydrogen. It has been found that such a hydrogen-enriched silicon nitride has an increased selectivity in anisotropic or directional silicon dioxide etch processes, without creating wafer contamination problems that cause defective integrated circuits.

SUMMARY OF THE INVENTION

The invention provides a method of fabricating an integrated circuit comprising: providing a semiconductor wafer; creating a layer of silicon nitride on the wafer incorporating hydrogen in the silicon nitride; creating a silicon oxide layer on the layer of silicon nitride; and patterning the silicon oxide in a process including directionally etching through selected areas of the silicon oxide and stopping the etch on the silicon nitride layer. The present invention provides a $Si_3N_4$ film with elevated hydrogen content to interact with a dry etch process to retard the etch rate. Any method used to increase hydrogen content in a $Si_yN_x$ film may be employed, including ion implantation, optimization of PECVD or LPCVD, and other processes where the hydrogen content of the film is elevated above that in the standard prior art process.

The invention also provides an integrated circuit comprising a layer of silicon dioxide and an etch stop, the etch stop means comprising silicon nitride incorporating hydrogen. The invention not only provides an enhanced etch stop layer for use in etching silicon dioxide, but offers one that can be made with standard integrated circuit fabrication apparatus and processes.

DESCRIPTION OF THE PREFERRED EMBODIMENT

1. Overview.

Figure 1:
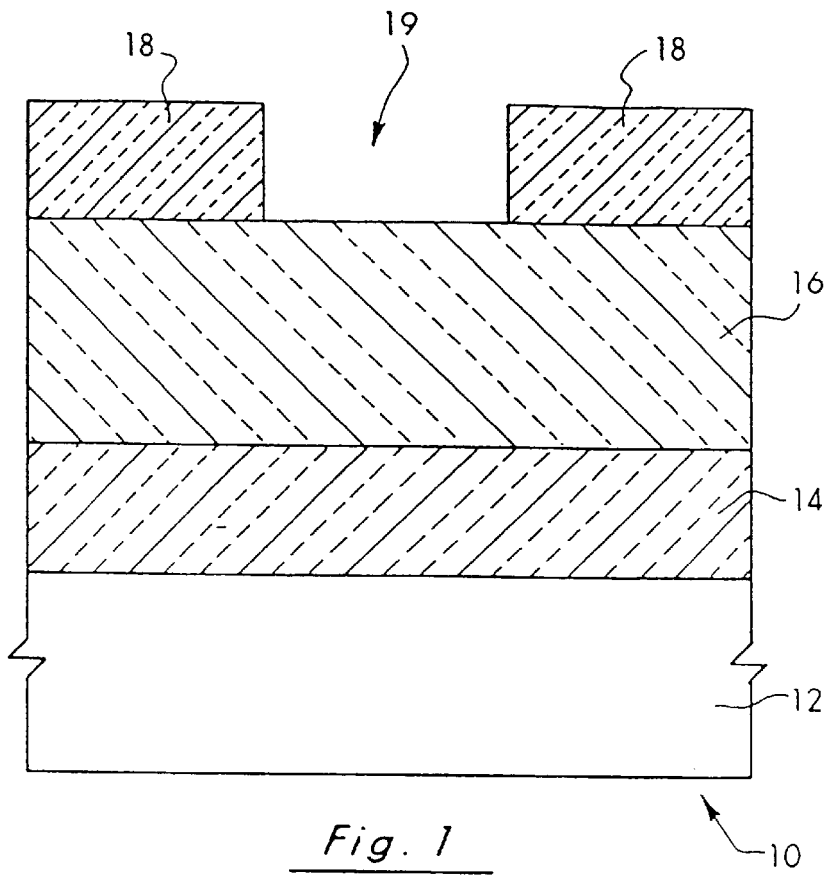
FIG. 1 is a cross-sectional view of a portion of a semiconductor wafer in accordance with the present invention just prior to the silicon dioxide etch.

FIG. 1 shows a cross-sectional view of a semiconductor wafer 10 according to the preferred embodiment of the invention. It should be understood that the figures are not meant to be actual cross-sectional views of any particular portion of an actual semiconductor device, but are merely idealized representations which are employed to more clearly and fully depict the process of the invention than would otherwise be possible.

Wafer 10 comprises a semiconductor substrate 12, preferably, lightly doped P-type silicon, silicon nitride etch stop layer 14, silicon dioxide layer 16, and resist layer 18. Resist layer 18 has been subjected to a photo mask and etch process to define an area 19 where the silicon dioxide 16 is to be patterned by a directional oxide etch. In an actual semiconductor wafer 10, the silicon substrate may be more complex than shown, including doped wells and other structures which are not pertinent to the invention and therefore are not shown. Other non-pertinent structures may also be present.

The term "silicon nitride" herein means $Si_xN_y$, where x is generally 3 but may also be 4 or any other number which indicates a number of atoms of silicon that will form a stable compound with y nitrogen atoms, and y is usually 4 but may be any other number that represents a number of nitrogen atoms that will form a stable compound with x silicon atoms. The term "hydrogenated silicon nitride" as used herein means silicon nitride having atomic hydrogen and/or hydrogen compounds incorporated therein in sufficient concentration so as to affect etch rate of the hydrogenated silicon nitride as compared to conventional silicon nitride.

Figure 2:
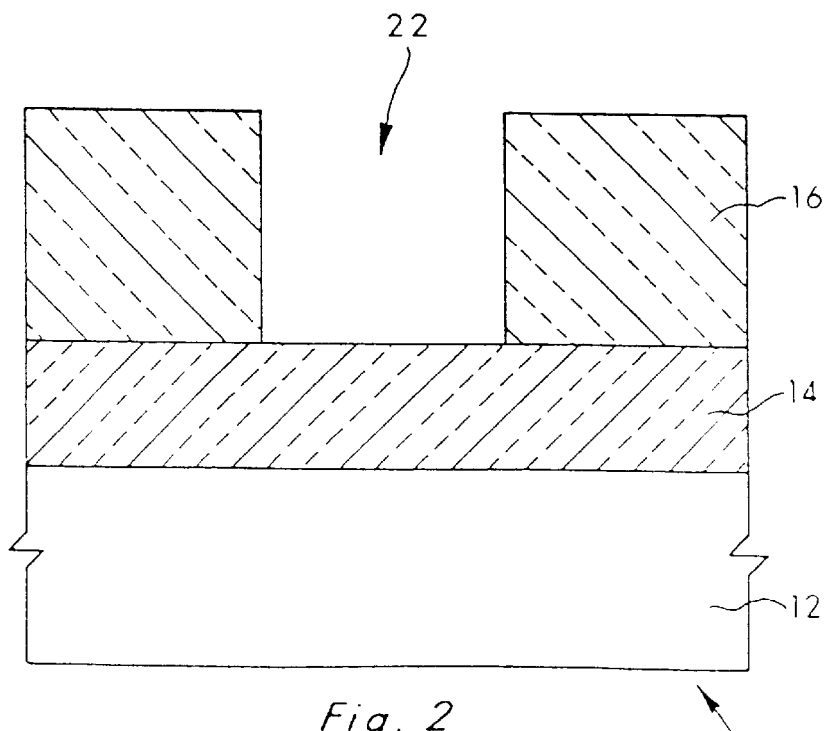
FIG. 2 is a cross-sectional view of the wafer of FIG. 1 after the oxide etch and resist strip.

In FIG. 2 the directional oxide etch, preferably a dry etch using fluorine chemistry, has been performed. Oxide 16 has been anisotropically etched through in area 22 to expose a portion of silicon nitride etch stop layer 14. In practice, the oxide etch may penetrate the silicon nitride layer 14 a small amount. Thus, when it is stated that the etch stops "on" the silicon nitride, the word "on" includes both the case where the etch goes to the silicon nitride 14 and stops and the case where it also to some degree etches the silicon nitride and stops in the silicon nitride. Although silicon nitride etch stop layer 14 is illustrated in a position below or underneath etchable oxide layer 16, it is expressly understood that etch stop layer 14 will function in any position (i.e., above, below, or along side) an etchable oxide layer. Etch stop layer 14 need only be adjacent to etchable oxide layer 16 to meet the needs of the present invention.

In accordance with the preferred embodiment, silicon nitride layer 14 has been formed by one of a group of novel processes that produce silicon nitride with enhanced selectivity in the oxide etch. Analysis, which shall be discussed in detail below, indicates that the group of processes increase the hydrogen content of the silicon nitride 14 preferably by incorporating hydrogen in quantities greater than $1 \times 10^{15}$ atoms per cubic centimeter utilizing N—H bonding, Si—H bonding, or free hydrogen entrapment. Hence, silicon nitride 14 when manufactured in accordance with the present invention is alternatively referred to as hydrogenated silicon nitride. Increased hydrogen content is believed to be the reason for the enhanced selectivity.

2. Detailed Description of Fabrication Process

Returning now to FIGS. 1 and 2, the processes of forming substrate 12, oxide 16, and resist 18 layers are conventional and will not be discussed in detail herein. The photo mask and etch process and the oxide etch that patterns silicon oxide 16 are also processes that are well-known in the art and thus will not be discussed in detail herein. The preferred oxide etch is an anisotropic dry fluorine-chemistry based etch. As is well-known, such etches utilize a plasma of gases, such as $CF_4$, $C_2F_6$, $SF_6$, or $NF_3$, that in a plasma provide fluorine radicals which act as chemical etchants, and the plasma also provides ions that are accelerated toward the surface of the silicon oxide 16 and etch it by forming volatile compounds. The process of forming the silicon nitride layer 14 may be any one of a group of variations of conventional silicon nitride formation processes.

The preferred process for formation of the silicon nitride 14 is a PECVD (Plasma Enhanced Chemical Vapor Deposition) process utilizing an Applied Materials Deposition tool, model Precision 5000, known as an AMD 5000™ in the art. A series of wafers of silicon nitride deposited on a silicon substrate were made in the AMD 5000™ PECVD process utilizing the following basic recipe: 2000 sccm N2, 55 sccm NH3, 125 sccm SiH4, RF Power 350 Watts, susceptor set point temperature 400° C. Various alterations of this basic recipe were also performed, namely varying the flow rates of the supply gases. The films were subsequently etched, also in an Applied Materials Precision 5000 Etcher, known as an AME 5000 in the art, using a single etch condition, namely 35 sccm CHF3, 25 sccm CF4, 60 sccm Ar, 700 W RF Power, and a magnetic field of 75 Gauss.

TABLE I

| WAFER NO. | $SiH_4$ FLOW (SCCM) | $NH_3$ FLOW (SCCM) | $N_2$ FLOW (SCCM) | ETCH RATE (A/SEC) |
|---|---|---|---|---|
| 1 | 200 | 55 | 2000 | 37.13 |
| 2 | 200 | 55 | 500 | 30.35 |
| 3 | 200 | 90 | 1250 | 33.44 |
| 4 | 200 | 125 | 2000 | 36.62 |
| 5 | 200 | 125 | 500 | 34.60 |
| 6 | 130 | 55 | 1250 | 31.78 |
| 7 | 130 | 90 | 1250 | 30.64 |
| 8 | 130 | 90 | 500 | 32.31 |
| 9 | 130 | 90 | 2000 | 26.64 |
| 10 | 55 | 55 | 2000 | 17.71 |
| 11 | 55 | 55 | 500 | 20.24 |
| 12 | 55 | 90 | 1250 | 18.90 |
| 13 | 55 | 125 | 2000 | 17.26 |
| 14 | 55 | 125 | 500 | 17.84 |

The etch rate of the samples when etched in a dry fluorine-based oxide etch was measured with the results shown in Table I. As seen in Table I, reducing the flow of silane, increasing the flow of ammonia, and decreasing the flow of nitrogen all yield lower etch rates. In a few instances reducing the nitrogen flow rate when the silane flow rate had already been reduced or the ammonia flow rate had already been raised increased the etch rate.

With the above evidence that the selectivity of the silicon nitride could be increased dramatically by decreasing the flow of silane, increasing the flow of ammonia, and decreasing the flow of nitrogen in the conventional silicon nitride formation process, seven silicon samples were made with the intention of discovering the reason for the increased selectivity. Wafer No. A1 was a control sample made by the standard process for making 1000A thick silicon nitride in an AMD 5000™ PECVD which is described in Table II. The SCCM units used in Table II are standard cubic centimeters per minute. The processes used to make seven sample wafers are summarized in Table III.

TABLE II

| | PREDEPOSITION STEP | DEPOSITION STEP |
|---|---|---|
| DEPOSITION TIME | 5.0 SECONDS | 9.7 SECONDS |
| HELIUM PRESSURE | 4.5 TORR | 4.5 TORR |
| SUSCEPTOR SET POINT | 400° C. | 400° C. |
| WAFER TEMPERATURE | 349° C. | 361° C. |
| POWER | 50 WATTS | 350 WATTS |
| NITROGEN FLOW | 2000 SCCM | 2000 SCCM |
| AMMONIA FLOW | 55 SCCM | 55 SCCM |
| SILANE FLOW | 0 | 125 SCCM |

TABLE III

| WAFER NO. | FABRICATION PROCESS SUMMARY | THICKNESS |
|---|---|---|
| A1 | AMD 5000 ™ CONTROL | 1000A |
| A2 | 2 × $NH_3$ | 1000A |
| A3 | 2 × $NH_3$, ½ $N_2$ | 1000A |
| A4 | 2 × $NH_3$, ½ $N_2$, ¼ $SiH_4$ | 1680A |
| A5 | 2 × $NH_3$, ½ $N_2$, .78 PRES. | 1000A |
| A6 | STANDARD LPCVD PROCESS | 2400A |
| A7 | STAND. NOVELLUS ™ PECVD, PULSED | 5400A |

In Table III the numbers indicated the amount that the flow of the particular gas was increased or decreased as compared to the AMD 5000™ control process; for example, $2 \times NH_3$ indicates that the flow of ammonia was doubled to 110 SCCM. For all the wafers the silicon nitride was deposited on a single crystal silicon substrate.

Three of the above samples (A4, A6, and A7) were wet etched with an HF solution to give a quick and rough idea of hydrogen content. The results are shown in Table IV. In Table IV the etch concentration gives the ratio of deionized water to hydrofluoric acid (HF) used in the etch; that is, an etch concentration of 5:1 indicates that the hydrofluoric acid was diluted with 5 parts of deionized water to 1 part of HF. In the wet etch process, the hydrogen in the silicon nitride film increases the etch rate in an HF containing solution and therefore may be used as an indicator of hydrogen content.

TABLE IV

| WAFER NO. | ETCH CONC. | ETCH RATE |
|---|---|---|
| A4 | 5:1 | 37.3 A/SEC |
| A6 | 5:1 | 0.9 A/SEC |
| A7 | 5:1 | 19.6 A/SEC |

The results of Table IV suggest that wafer A6 has the lowest amount of hydrogen and wafer 4 contains the highest amount of hydrogen. The seven sample wafers were then analyzed for hydrogen content by performing SIMS (Secondary Ion Mass Spectroscopy) profiles with the results summarized in FIGS. 3–6. The SIMS profiles shown in FIG. 3–FIG. 6 are presented to show qualitative effects of the various processing and are not necessarily quantitatively accurate because of film thickness differences between the samples and other random noise generated during the SIMS analysis.

In the SIMS set up the sputtering ion beam was 7 keV cesium atoms with the following characteristics: measured current of 30 nanoamps, incident raster of 500 mm$^2$, angle of incidence=60 degrees with respect to analyzer (note: analyzer is normal to the surface of the sample), primary gating 70%, the mass resolution was 30, the sputter rate was 100 A/minute, and the relative scanning factor used for all curves was $1 \times 10^{20}$ with respect to a silicon isotope with an atomic mass of 56 units.

Figure 3:
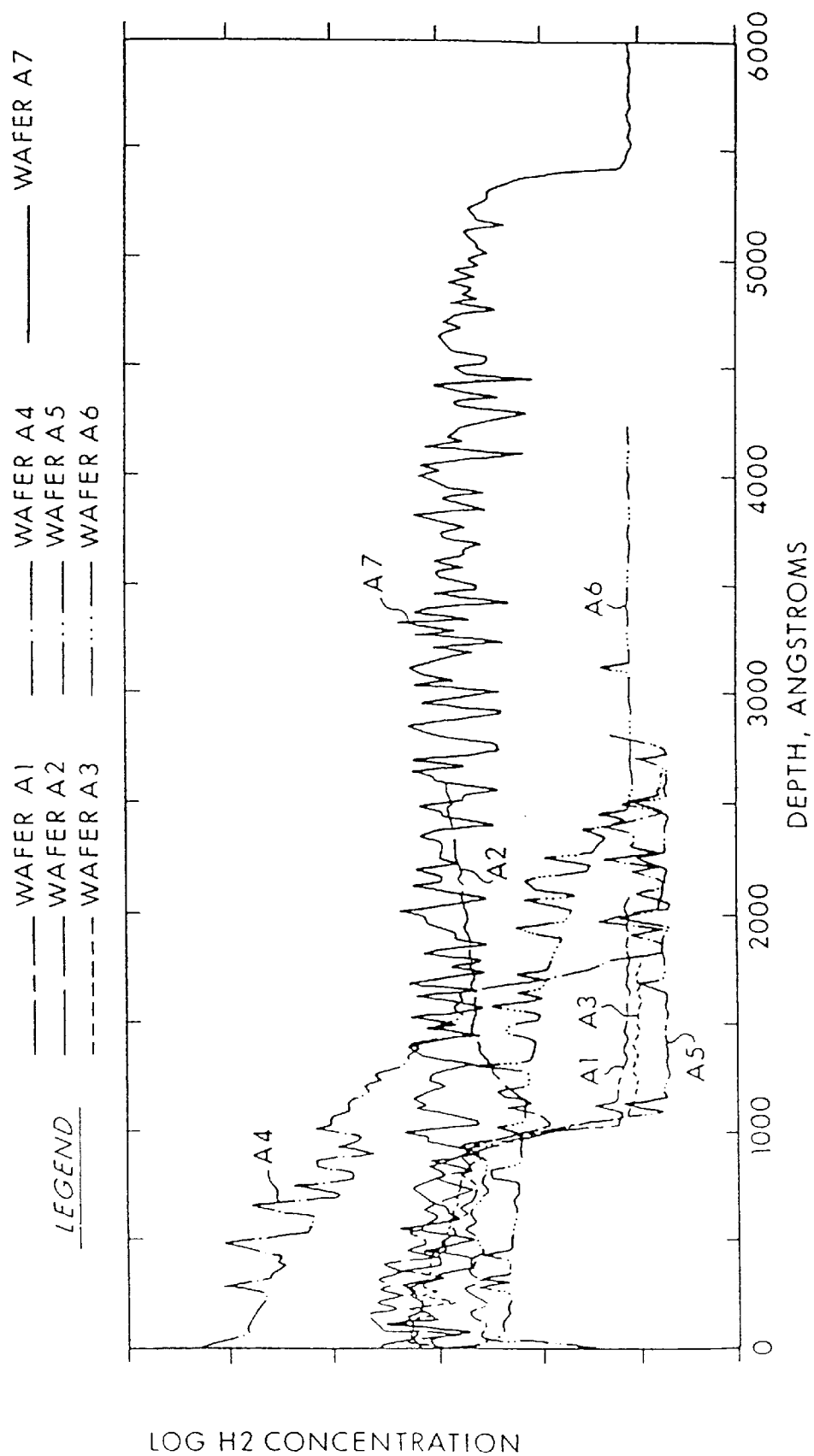
FIG. 3 is an $H_2$ depth profile comparison of seven semiconductor wafer illustrating the entrapped $H_2$ in wafers made by various processes.
Figure 4:
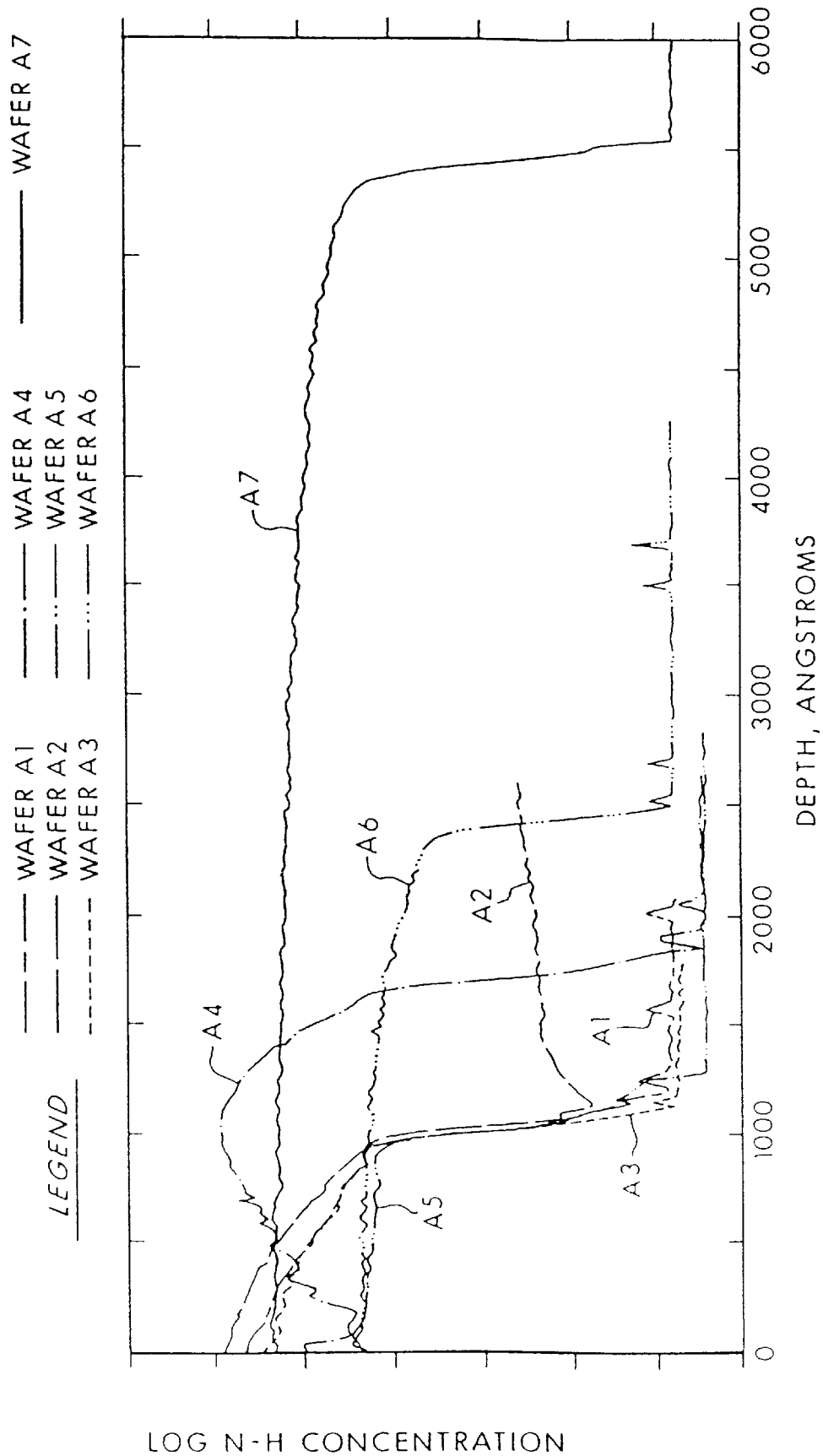
FIG. 4 is an N—H depth profile comparison of seven semiconductor wafer illustrating the N—H bonded hydrogen in wafers made by various processes.
Figure 5:
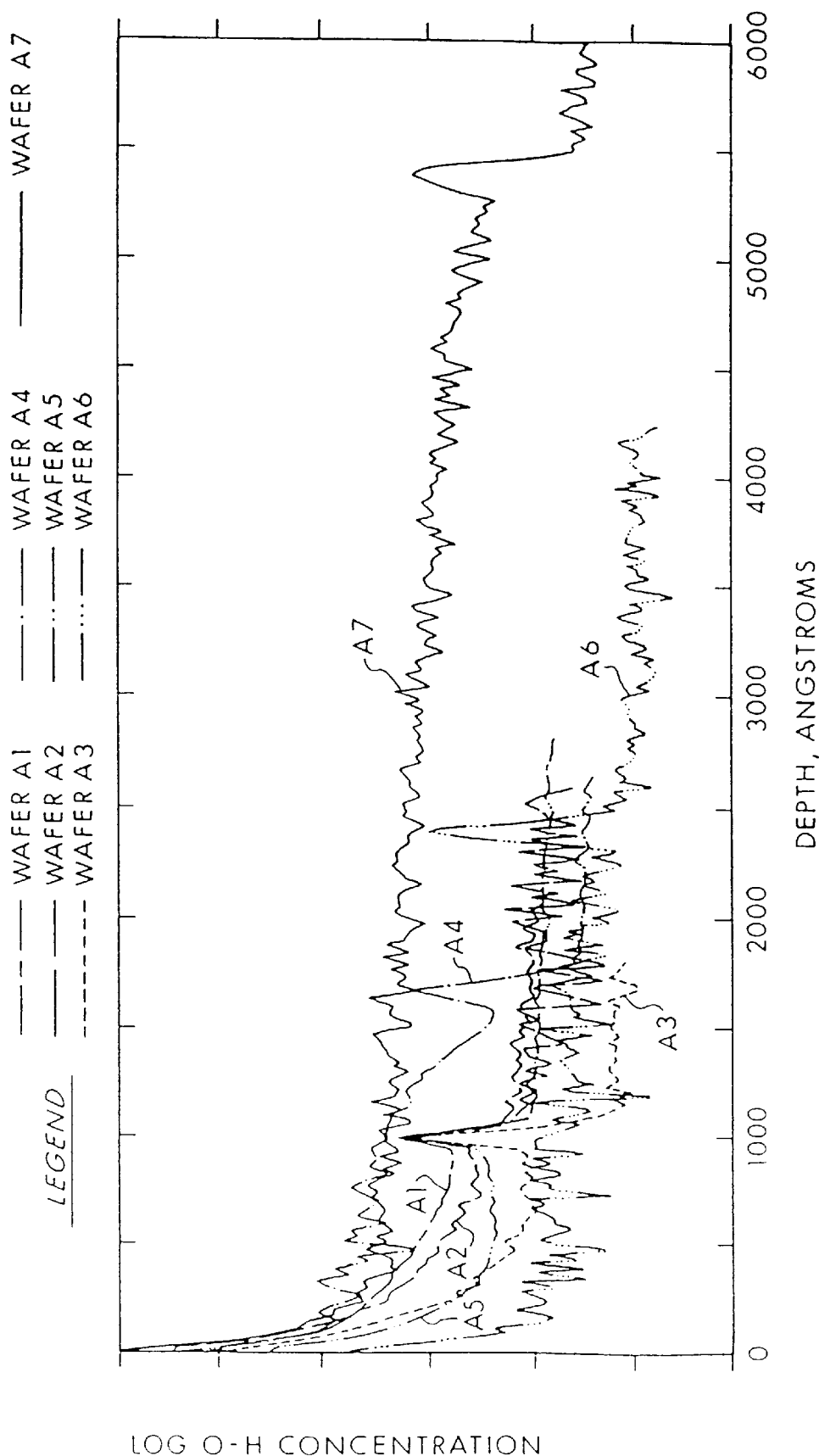
FIG. 5 is an O—H depth profile comparison of seven semiconductor wafer illustrating the O—H bonded hydrogen in wafers made by various processes.
Figure 6:
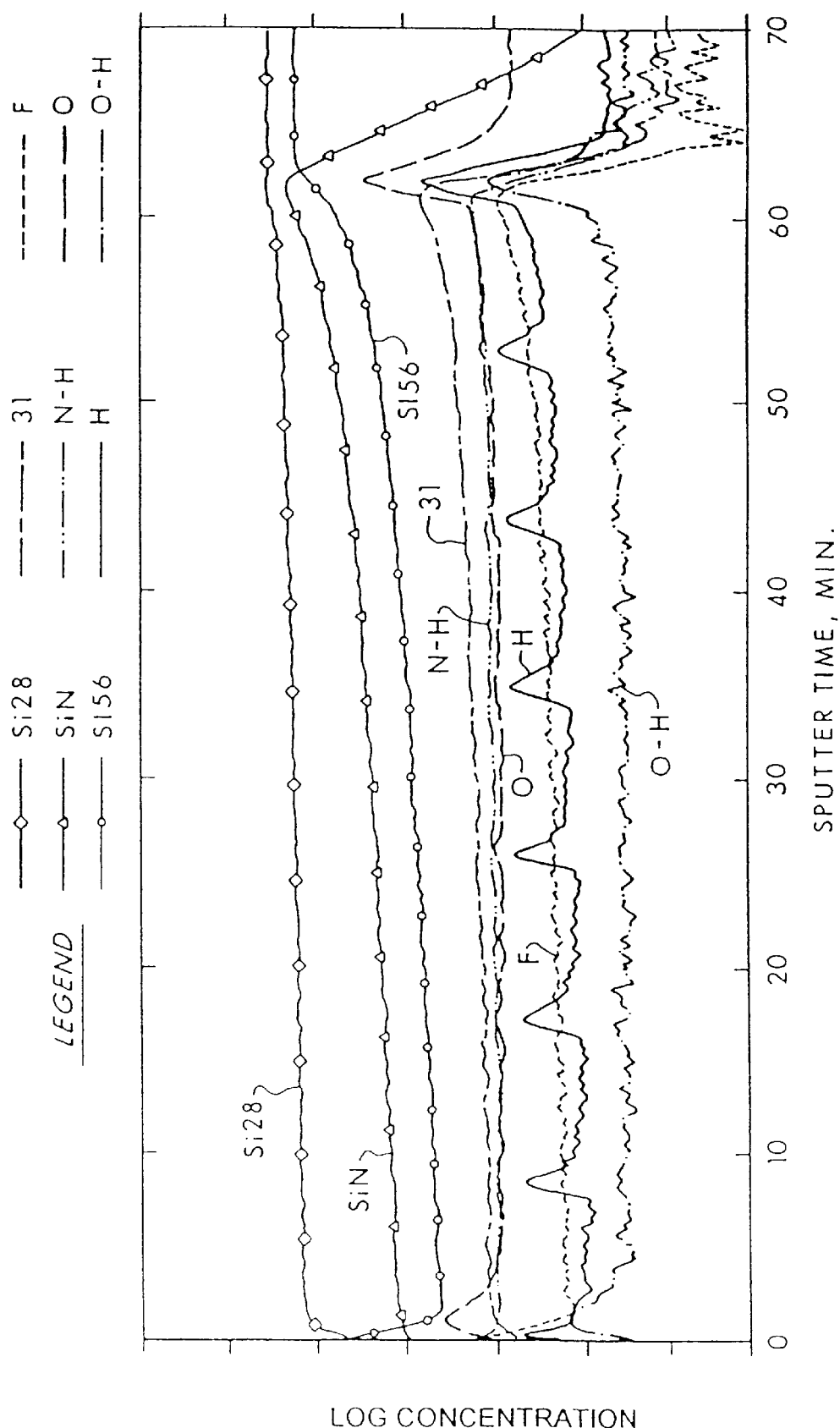
FIG. 6 is a depth profile comparison of single semiconductor wafer processed by PECVD in a pulsed RF field.

FIGS. 3 through 5 confirm that wafer A4 has the highest hydrogen concentration while wafer A6 has the least. The others fall appropriately in-between to indicate that the increased selectivity is due to hydrogen content. In FIG. 6 the seven peaks of increased hydrogen content correspond to seven pulses off and on of the RF filed during the PECVD fabrication process. In other words, each time the RF filed was turned off then turned back on, a peak appears in the hydrogen content. This shows that pulsing the RF field during a PECVD process or its equivalent increases the hydrogen content.

It is postulated that the increased hydrogen increases the selectivity by combining with carbon and halogens that are in the etch plasma to form halocarbon polymer deposits on the surface of the silicon nitride, which deposits slow or stop the etch process. The carbon may be introduced into the plasma either in the feed gas, from the etch mask, or from contaminants in the system. Further, N—H bonds have the potential of reacting with fluorine to form nonvolatile ammonium fluoride at the silicon nitride surface, which can further impede or stop the etching of the nitride film.

From the above, it is clear that any manner of adding the hydrogen to the silicon nitride will be effective in providing an enhanced etch stop layer 14. For example, the hydrogen content of the silicon nitride may be enhanced by any one of a number of relatively simple adjustments to the standard silicon nitride deposition processes: e.g. hydrogen gas may be added to the standard CVD or PECVD process, which will increase the hydrogen content of the silicon nitride. Another manner of depositing the silicon nitride that can provide better control of the materials being deposited is ECR (Electron Cyclotron Resonance) deposition. Preferably, silicon nitride etch stop in accordance with the present invention incorporates hydrogen in quantities greater than approximately $1 \times 10^{15}$ atoms per cubic centimeter, utilizing N—H bonding, Si—H bonding, or free hydrogen entrapment, based upon the concentrations at which it is believed to begin to depress the etch rate of the silicon nitride.

It is also evident that the etch stop layer provided by the invention will be an effective etch stop for etches other than a silicon dioxide etch. For example, the layer 16 may be made of a low-hydrogen-content $Si_xN_y$ where x is any number of silicon atoms which will combine with nitrogen, and y is any number of nitrogen atoms that will combine with x silicon atoms. Likewise, as indicated above, the layer 14 may also be made of a silicon nitride other than $Si_3N_4$. It may be made of $Si_xN_y$, where x and y have the same meaning as indicated above, as long as the material that is to be the etch stop layer 14 is hydrogen enriched.

There has been described a novel etch stop material which has higher selectivity in a dry, fluorine-based silicon dioxide etch and which has many other advantages. A number of novel processes for making the material have also been described. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it is seen that hydrogen enhances the etch stop qualities of silicon nitride, many other ways of adding hydrogen to the material may be devised. Or the various processes described to make the material may be varied greatly. Or the hydrogen-enriched material may be used as an etch with other etch processes. Consequently, the invention is to be construed as embracing each and every novel feature and novel combination of features present in and/or possessed by the semiconductor device described.

What is claimed is:

1. A method of fabricating an integrated circuit comprising:

providing a semiconductor wafer;

creating a layer of hydrogenated silicon nitride on said wafer, the layer of hydrogenated silicon nitride comprising N—H bonds in quantities greater than $1 \times 10^{15}$ atoms per cubic centimeter;

creating an etchable layer on said layer of silicon nitride; and patterning said etchable layer in a process including etching through selected areas of said etchable layer and stopping said etch on said hydrogenated silicon nitride layer.

2. The method as in claim 1 wherein said step of creating a layer of hydrogenated silicon nitride includes forming N—H bonds.

3. The method as in claim 1 wherein said step of creating a layer of hydrogenated silicon nitride includes forming entrapped hydrogen in said silicon nitride.

4. The method as in claim 3 wherein said step of creating a layer of hydrogenated silicon nitride comprises a plasma enhanced chemical vapor deposition process.

5. The method as in claim 3 wherein said step of creating a layer of hydrogenated silicon nitride comprises a low pressure chemical vapor deposition (LPCVD) process.

6. The method as in claim 1 wherein said step of creating a layer of hydrogenated silicon nitride comprises a plasma enhanced chemical vapor deposition (PECVD) process.

7. The method as in claim 6 wherein said PECVD process includes the step of providing more $NH_3$ than the $NH_3$ in a standard PECVD process to produce silicon nitride.

8. The method as in claim 6 wherein said PECVD process includes the step of providing less $SiH_4$ than the amount of $SiH_4$ in a standard PECVD process to produce silicon nitride.

9. The method as in claim 6 wherein said PECVD process includes the step of providing less nitrogen than the amount of nitrogen in a standard PECVD process to produce silicon nitride.

10. The method as is claim 1 wherein said etchable layer is silicon nitride.

11. The method as in claim 10 wherein said etching process comprises etching in a halogen containing plasma.

12. The method as in claim 1 wherein said etchable layer is made of silicon dioxide.

13. The method as in claim 12 wherein said etching process is a dry fluorine chemistry etch.

14. The method as in claim 1 wherein said step of creating a layer of silicon nitride comprises electron cyclotron resonance deposition.

15. A method of fabricating an integrated circuit comprising:

providing a semiconductor wafer;

creating a layer of hydrogenated silicon nitride on said wafer using a PECVD process providing $NH_3$ in excess of that required to produce silicon nitride to create N—H bonds in quantities greater than $1 \times 10^{15}$ atoms per cubic centimeter;

creating a silicon oxide layer on said layer of hydrogenated silicon nitride; and patterning said silicon oxide in a process including etching through selected areas of said silicon oxide, stopping said etch on said hydrogenated silicon nitride layer.

16. A method of fabricating an integrated circuit comprising:

providing a semiconductor wafer, creating a layer of silicon nitride on said wafer using a PECVD process;

hydrogen enriching the silicon nitride by decreasing flow of $SiH_4$ during the step of creating a layer of silicon nitride to create N—H bonds in quantities greater than $1 \times 10^{15}$ atoms per cubic centimeter;

creating a silicon oxide layer on said layer of silicon nitride; and patterning said silicon oxide in a process including etching through selected areas of said silicon oxide, stopping said etch on said silicon nitride layer.

17. A method of fabricating an integrated circuit comprising:

providing a semiconductor wafer;

creating a layer of silicon nitride on said wafer using a PECVD process;

hydrogen enriching the silicon nitride layer by decreasing concentration of nitrogen during the PECVD process to create N—H bonds in quantities greater than $1 \times 10^{15}$ atoms per cubic centimeter;

creating a silicon oxide layer on said layer of silicon nitride; and patterning said silicon oxide in a process including etching through selected areas of said silicon oxide, stopping said etch on said silicon nitride layer.

18. A method of fabricating an integrated circuit, the method comprising the steps of:

(a) providing a substrate;

(b) creating a layer of hydrogenated silicon nitride on the wafer using a flow of silane between 130 and 200 sccm, a flown of ammonia between 55 and 125 sccm, and a flow of nitrogen between 500 and 2000 sccm;

(c) creating an etchable layer over the layer of hydrogenated silicon nitride; and (d) etching through at least one portion of the etchable layer and stopping the etch on the layer of hydrogenated silicon nitride.

19. The method, as set forth in claim 18, wherein step (b) comprises the step of creating the layer of hydrogenated silicon nitride having hydrogen in quantities greater than $1 \times 10^{15}$ atoms per cubic centimeter.

20. A method of fabricating an integrated circuit comprising:

providing a semiconductor wafer;

creating a layer of hydrogenated silicon nitride on said wafer;

creating an etchable layer on said layer of silicon nitride; and patterning said etchable layer in a process including etching through selected areas of said etchable layer and stopping said etch on said hydrogenated silicon nitride layer.

21. The method as in claim 20 wherein said step of creating a layer of hydrogenated silicon nitride includes forming N—H bonds.

22. The method as in claim 20 wherein said step of creating a layer of hydrogenated silicon nitride includes forming entrapped hydrogen in said silicon nitride.

23. The method as in claim 20 wherein said step of creating a layer of hydrogenated silicon nitride comprises a low pressure chemical vapor deposition (LPCVD) process.

24. The method as in claim 20 wherein said step of creating a layer of hydrogenated silicon nitride comprises a plasma enhanced chemical vapor deposition (PECVD) process.

25. The method as in claim 24 wherein said PECVD process includes the step of providing more $NH_3$ than the $NH_3$ in a standard PECVD process to produce silicon nitride.

26. The method as in claim 24 wherein said PECVD process includes the step of providing less $SiH_4$ than the amount of $SiH_4$ in a standard PECVD process to produce silicon nitride.

27. The method as in claim 24 wherein said PECVD process includes the step of providing less nitrogen than the amount of nitrogen in a standard PECVD process to produce silicon nitride.

28. The method as in claim 20 wherein said etchable layer is silicon nitride.

29. The method as in claim 28 wherein said etching process comprises etching in a halogen containing plasma.

30. The method as in claim 20 wherein said etchable layer is made of silicon dioxide.

31. The method as in claim 30 wherein said etching process is a dry fluorine chemistry etch.

32. The method as in claim 20 wherein said step of creating a layer of silicon nitride comprises electron cyclotron resonance deposition.

33. A method of fabricating an integrated circuit comprising:

providing a semiconductor wafer;

creating a layer of hydrogenated silicon nitride on said wafer using a PECVD process providing $NH_3$ in excess of that required to produce silicon nitride;

creating a silicon oxide layer on said layer of hydrogenated silicon nitride; and patterning said silicon oxide in a process including etching through selected areas of said silicon oxide, stopping said etch on said hydrogenated silicon nitride layer.

34. A method of fabricating an integrated circuit comprising:

providing a semiconductor wafer;

creating a layer of silicon nitride on said wafer using a PECVD process;

hydrogen enrchig the silicon nitride by decreasing flow of $SiH_4$ during the step of creating a layer of silicon nitride;

creating a silicon oxide layer on said layer of silicon nitride; and patterning said silicon oxide in a process including etching through selected areas of said silicon oxide, stopping said etch on said silicon nitride layer.

35. A method of fabricating an integrated circuit comprising:

providing a semiconductor wafer;

creating a layer of silicon nitride on said wafer using a PECVD process;

hydrogen enriching the silicon nitride layer by decreasing concentration of nitrogen during the PECVD process;

creating a silicon oxide layer on said layer of silicon nitride; and patterning said silicon oxide in a process including etching through selected areas of said silicon oxide, stopping said etch on said silicon nitride layer.

36. A method of fabricating an integrated circuit, the method comprising the acts of:

(a) providing a substrate;

(b) forming a layer of hydrogenated silicon nitride on the substrate;

(c) forming an etchable layer over the layer of hydrogenated silicon nitride; and (d) etching trough selected areas of the etchable layer and stopping the etch on the layer of hydrogenated silicon nitride.

37. The method, as set forth in claim 36, wherein act (b) comprises the act of:

forming the layer of hydrogenated silicon nitride having a hydrogen concentration of greater than $1\times10^{15}$ atoms per cubic centimeter.

38. The method, as set forth in claim 36, wherein act (b) comprises the act of forming N—H bonds in the layer of hydrogenated silicon nitride in a concentration of greater than $1\times10^{15}$ atoms per cubic centimeter.

39. The method, as set forth in claim 36, wherein act (b) comprises the act of forming entrapped hydrogen in the layer of hydrogenated silicon nitride in a concentration of greater than $1\times10^{15}$ atoms per cubic centimeter.

40. The method, as set forth in claim 36, wherein act (b) comprises the act of: forming N—H bonds in le layer of hydrogenated silicon nitride.

41. The met hod, as set forth in claim 36, wherein act (b) comprises the act of:

forming entrapped hydrogen in the layer of hydrogenated silicon nitride.

42. The method, as set forth in claim 36, wherein act (c) comprises the act of:

forming the etchable layer of silicon oxide.

43. The method, as set forth in claim 36, wherein act (d) comprises the act of using an etchant, wherein the layer of hydrogenated silicon nitride has a first selectivity to the etchant the etchable layer has a second selectivity to the etchant, the first seclectivity being higher than the second selectivity.

* * * * *